United States Patent
Radens et al.

(10) Patent No.: US 9,755,030 B2
(45) Date of Patent: Sep. 5, 2017

(54) METHOD FOR REDUCED SOURCE AND DRAIN CONTACT TO GATE STACK CAPACITANCE

(71) Applicant: International Business Machines Corporation, Armonk, NY (US)

(72) Inventors: Carl John Radens, LaGrangeville, NY (US); Richard Quimby Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/972,824

(22) Filed: Dec. 17, 2015

(65) Prior Publication Data

US 2017/0179240 A1    Jun. 22, 2017

(51) Int. Cl.
| | |
|---|---|
| *H01L 29/41* | (2006.01) |
| *H01L 29/417* | (2006.01) |
| *H01L 29/45* | (2006.01) |
| *H01L 23/528* | (2006.01) |
| *H01L 23/532* | (2006.01) |

(Continued)

(52) U.S. Cl.
CPC .... *H01L 29/41766* (2013.01); *H01L 21/0273* (2013.01); *H01L 21/30604* (2013.01); *H01L 21/30625* (2013.01); *H01L 21/6835* (2013.01); *H01L 21/76831* (2013.01); *H01L 21/76877* (2013.01); *H01L 21/76895* (2013.01); *H01L 23/528* (2013.01); *H01L 23/53214* (2013.01); *H01L 23/53228* (2013.01); *H01L 23/53257* (2013.01); *H01L 29/45* (2013.01); *H01L 2221/6834* (2013.01); *H01L 2221/68318* (2013.01); *H01L 2221/68327* (2013.01); *H01L 2221/68359* (2013.01)

(58) Field of Classification Search
CPC .................................................. H01L 29/4966
See application file for complete search history.

(56) References Cited

U.S. PATENT DOCUMENTS

| | | | | |
|---|---|---|---|---|
| 6,054,772 A | * | 4/2000 | Mostafazadeh | ..... H01L 23/3107 257/781 |
| 6,256,207 B1 | * | 7/2001 | Horiuchi | ............... H01L 21/563 174/255 |

(Continued)

FOREIGN PATENT DOCUMENTS

CN    103681331 A    9/2012

OTHER PUBLICATIONS

List of IBM Patents or Patent Applications Treated as Related.

*Primary Examiner* — Evren Seven
*Assistant Examiner* — S. M. S Imtiaz
(74) *Attorney, Agent, or Firm* — Jeffrey S LaBaw; Steven J Meyers

(57) ABSTRACT

A structure and method for fabricating a semiconductor device is described. A device structure including a gate structure, a source region and a drain region is disposed on a first surface of a substrate. Contact holes are etched through the source and drain regions and through a first portion of the substrate. The contact holes are filled with a conductive material to produce contact studs coupled to the source and drain regions. A second portion of the substrate is removed. A surface of the contact studs is exposed through a second surface of the substrate opposite to the gate structure for connection to a wiring layer disposed over the second surface of the substrate.

15 Claims, 16 Drawing Sheets

(51) Int. Cl.
  *H01L 21/306* (2006.01)
  *H01L 21/768* (2006.01)
  *H01L 21/683* (2006.01)
  *H01L 21/027* (2006.01)

(56) References Cited

U.S. PATENT DOCUMENTS

| | | | | |
|---|---|---|---|---|
| 6,350,642 | B1* | 2/2002 | Lee | H01L 21/76816 257/E21.507 |
| 6,376,278 | B1* | 4/2002 | Egawa | H01L 21/56 257/E21.502 |
| 6,455,430 | B2* | 9/2002 | Abe | H01L 21/3146 257/E21.27 |
| 6,613,684 | B2* | 9/2003 | Fujimoto | H01L 21/76801 438/706 |
| 6,664,158 | B2* | 12/2003 | Dehm | H01L 27/11507 257/E21.664 |
| 7,741,663 | B2 | 6/2010 | Hause | |
| 7,811,871 | B2 | 10/2010 | Anderson | |
| 8,458,900 | B2* | 6/2013 | Kodani | H01L 21/4853 29/832 |
| 8,513,742 | B2 | 8/2013 | Zhong | |
| 8,642,403 | B1* | 2/2014 | Cohen | H01L 29/775 257/124 |
| 8,685,817 | B1 | 4/2014 | Cai | |
| 8,698,303 | B2* | 4/2014 | Furutani | H05K 1/113 257/668 |
| 8,716,091 | B2* | 5/2014 | Cohen | H01L 21/823412 257/E21.431 |
| 8,810,040 | B2* | 8/2014 | Kaneko | H05K 1/111 257/258 |
| 8,815,669 | B2 | 8/2014 | Cai | |
| 9,064,943 | B1 | 6/2015 | Anderson | |
| 9,287,360 | B1* | 3/2016 | Basu | H01L 29/0673 |
| 2002/0090808 | A1* | 7/2002 | Jeon | H01L 21/76831 438/622 |
| 2005/0170548 | A1* | 8/2005 | Yoon | G02F 1/133553 438/57 |
| 2006/0102290 | A1* | 5/2006 | Harada | H01L 21/6835 156/349 |
| 2006/0131730 | A1* | 6/2006 | Nakamura | H01L 23/13 257/700 |
| 2006/0166494 | A1* | 7/2006 | Lee | H01L 21/76802 438/639 |
| 2006/0284225 | A1 | 12/2006 | Popp | |
| 2007/0207592 | A1* | 9/2007 | Lu | H01L 21/6835 438/455 |
| 2007/0238280 | A1* | 10/2007 | Seo | H01L 21/76831 438/597 |
| 2009/0130844 | A1* | 5/2009 | Jang | H01L 21/76814 438/653 |
| 2009/0224301 | A1* | 9/2009 | Yamakawa | H01L 27/11502 257/295 |
| 2009/0224339 | A1 | 9/2009 | Gogoi | |
| 2010/0147574 | A1* | 6/2010 | Kaneko | H01L 21/4853 174/261 |
| 2011/0233620 | A1 | 9/2011 | Naruse | |
| 2012/0013013 | A1* | 1/2012 | Sadaka | H01L 21/2007 257/773 |
| 2012/0086048 | A1 | 4/2012 | Park | |
| 2013/0175606 | A1* | 7/2013 | Cheng | H01L 21/823807 257/329 |
| 2013/0313647 | A1* | 11/2013 | Aquilino | H01L 21/823807 257/368 |
| 2013/0328151 | A1 | 12/2013 | Kao | |
| 2014/0159211 | A1* | 6/2014 | Lin | H01L 21/02164 257/632 |
| 2014/0326954 | A1 | 11/2014 | Han | |
| 2015/0200269 | A1 | 7/2015 | Yin | |
| 2015/0364546 | A1 | 12/2015 | Rodder | |
| 2016/0163796 | A1 | 6/2016 | Obradovic | |

\* cited by examiner

METHOD FOR REDUCED SOURCE AND DRAIN CONTACT TO GATE STACK CAPACITANCE

BACKGROUND OF THE INVENTION

This disclosure relates to integrated circuit devices, and more specifically, to a method and structure to reduce capacitance between gate and source/drain contact structures in semiconductor devices.

As the dimensions of modern integrated circuitry in semiconductor chips continue to shrink, conventional semiconductor processing is increasingly challenged to make structures at finer dimensions. Not only is the circuit density increasing, but the performance of the devices needs to remain high. The goals of high performance and high density conflict when the higher density causes undesired interactions between circuit elements. For example, as contact stubs and trenches come closer and closer to the gate structure, parasitic capacitance and gate to source/drain coupling are increased, thus degrading performance.

BRIEF SUMMARY

According to this disclosure, a structure and method for constructing the structure are described. In one aspect of the invention, a method for fabricating a semiconductor device is described. A device structure including a gate structure, a source region and a drain region is disposed on a first surface of a substrate. Contact holes are etched through the source and drain regions and through a first portion of the substrate. The contact holes are filled with a conductive material to produce contact studs coupled to the source and drain regions. A second portion of the substrate is removed. A surface of the contact studs is exposed through a second surface of the substrate opposite to the gate structure and available for connection to a wiring layer.

Another aspect of the invention is a semiconductor device including a transistor including a gate structure, a source region and a drain region disposed on a first surface of a substrate. A wiring layer of conductive material is disposed over a second surface of the substrate. The second surface is opposite to the first surface of the substrate. A set of contact studs electrically couple the source region and the drain region through the substrate to respective portions of the wiring layer.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
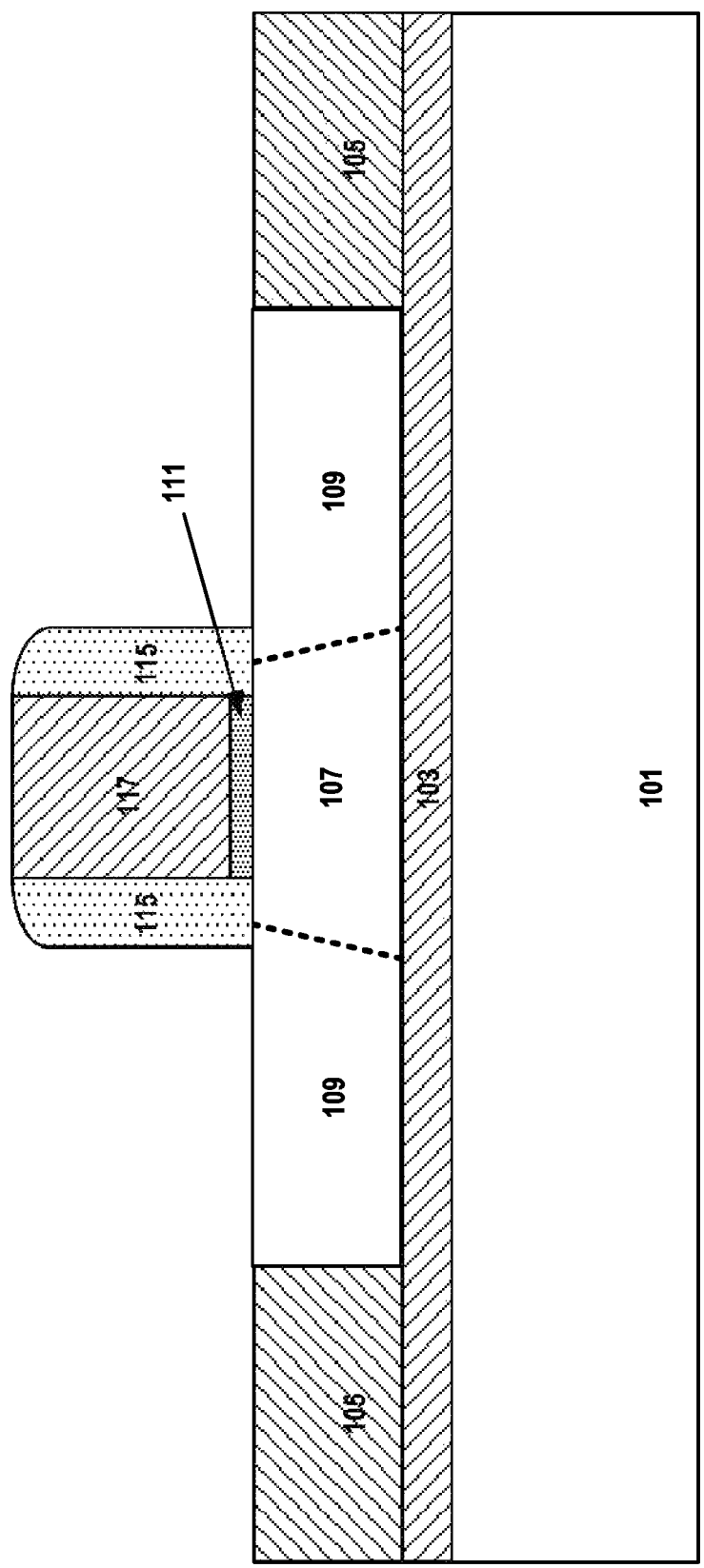
FIG. 1 is a cross-sectional diagram of a MOSFET device at a point in the process where the gate stack has been fabricated over a source/drain region according to a first embodiment of the invention.

At a high level, the invention includes a structure and method for fabricating a structure which reduces capacitive coupling between the gate structure and source and drain contacts by increasing the distance between the gate structure and the source and drain contacts while still keeping the lateral dimensions the same. The increase in distance is achieved by placing the contacts to the source and drain on an opposite side of a semiconductor wafer from the gate structure. For 14 nm and smaller VLSI technology, modern integrated circuits utilize extremely tight gate-to-gate pitch which makes the stud contacts to the source and drain regions physically very close to the gate stack structure. This tight gate-to-contact spacing causes higher capacitive coupling between the gate and source and drain which significantly impacts technology performance. By placing the metallization on the opposite side of the substrate, tight gate-to gate spacing can be maintained while increasing the distance between the gate structures and source and drain contacts, thus improving the performance of the device.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

While the process steps to fabricate one embodiment of the invention are described with reference to a planar metal-oxide-semiconductor field-effect transistor (MOSFET) device, other embodiments described below are incorporated in other devices having source/drain regions and gate structures such as fin field effect transistors (FinFETs) and Nanosheet or multichannel MOSFET transistors. By increasing the distance between the source/drain contacts and the gate structure while maintaining the horizontal spacing of the device elements, performance of a wide variety of devices at higher densities can be maintained.

Embodiments will be explained below with reference to the accompanying drawings.

FIG. 1 is a cross-sectional diagram of a planar MOSFET device at a point in the process where the gate stack has been fabricated over a source/drain region according to a first embodiment of the invention. At this point in the process, the structure is similar to that of a conventional planar MOSFET is in the process of being fabricated, however, the source and drain contacts to the metallization wiring have not yet been patterned. In one preferred embodiment, the structure is built on a conventional silicon or silicon on insulator (SOI) substrate, although other substrates can be used. In an SOI substrate, the bulk silicon 101 has an isolation layer 103, e.g., a BOX layer, which is typically considered part of the substrate 101. A BOX layer can be formed inside a single-crystal Si wafer e.g., by a process called Separation by IMplantation of OXygen (SIMOX) which uses an oxygen ion beam implantation process followed by high temperature annealing to create a buried SiO2 layer.

In one preferred embodiment, an extremely thin silicon on oxide (ETSOI) layer is over the BOX layer 103 to produce the device. Source and drain regions 109 and the SOI channel 107 are formed in the ETSOI layer. The dielectric layer 103 may be produced by a shallow isolation trench (STI) process which serves to isolate the active area of the device. STI can be formed by an etch process which etches the ETSOI layer using the oxide of the BOX layer as an endpoint. A gate dielectric layer 111 is disposed over the SOI channel 107. In one preferred embodiment, the gate dielectric layer 111 is formed of a high k oxide material, although other dielectrics or combinations of dielectrics may be used in other embodiments of the invention. Two spacers 115 and the gate stack 117 are disposed over the gate dielectric layer 111 and the SOI channel 107. The spacers 115 are preferably made of a dielectric material such as silicon nitride. The gate stack 117 is composed of a conductive material such as a doped polysilicon, a metallic material or a combination thereof. For example the gate stack can be composed of a combination of metals. Those skilled in the art will appreciate that other materials are used in different MOSFET devices and can be used in the present invention.

Figure 2:
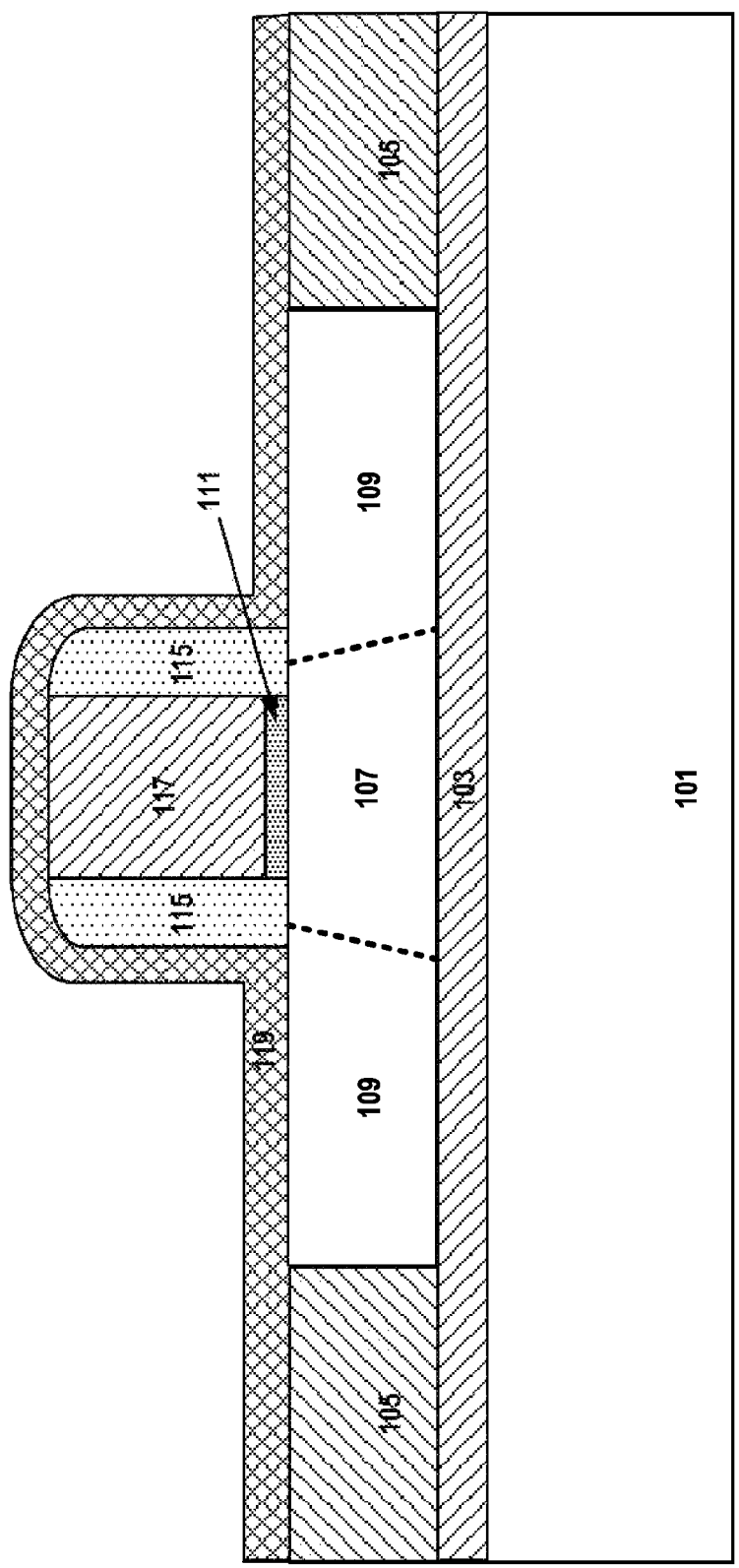
FIG. 2 is a cross-sectional diagram depicting the structure after a protective dielectric layer has been deposited according to a first embodiment of the invention.

FIG. 2 is a cross-sectional diagram depicting the structure after a protective dielectric layer 119 has been deposited according to a first embodiment of the invention. In one preferred embodiment, the dielectric layer 119 is comprised of silicon dioxide, however, other dielectrics may be used. The protective layer 119 helps protect the device when subsequent etches are applied. A typical material would be a dense oxide. In a preferred embodiment, SiO2 is used given other materials and layers used in the structure and the desire to maintain good etch selectivity.

Figure 3:
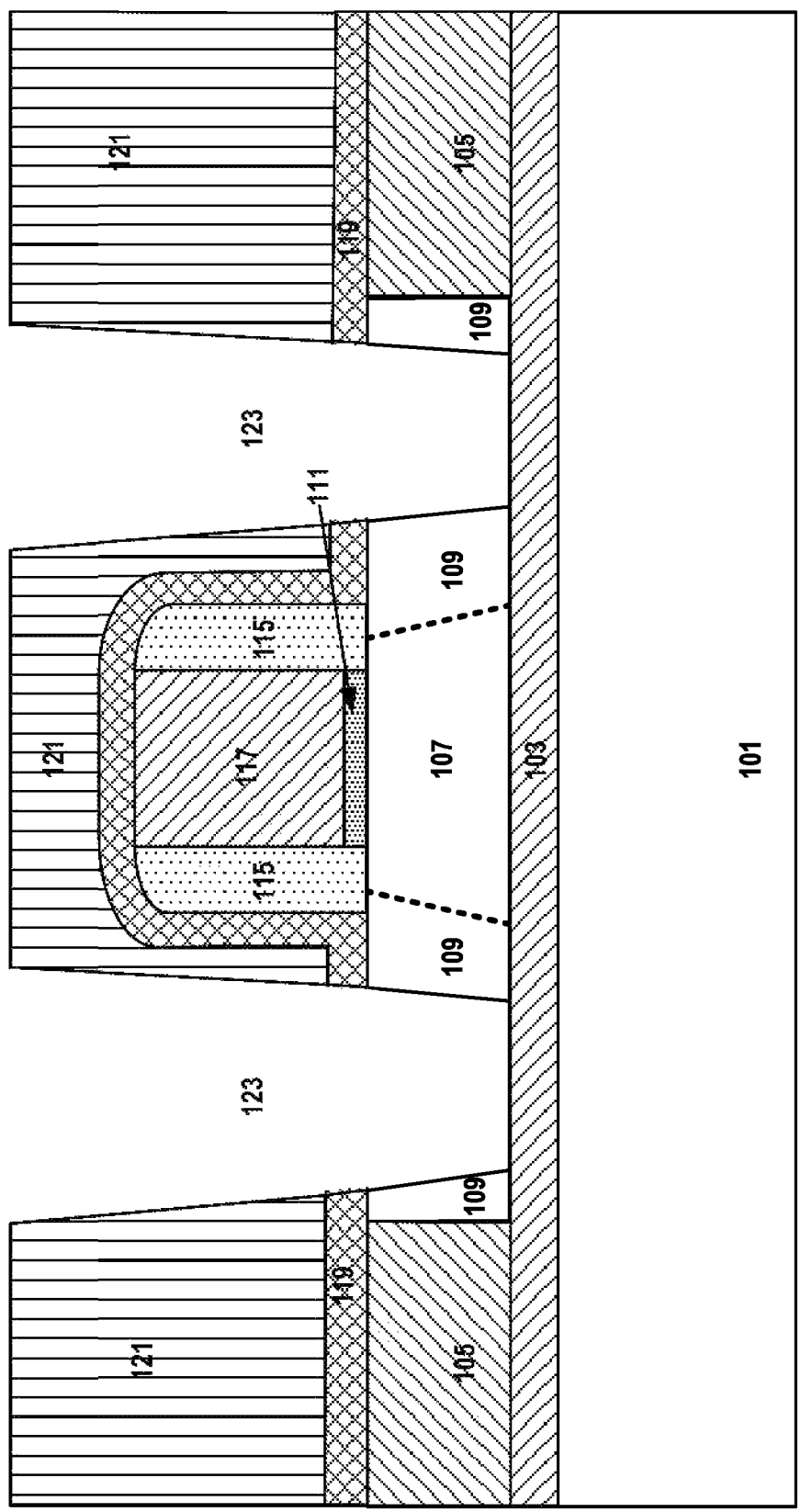
FIG. 3 is a cross-sectional diagram showing the structure after a contact mask and etch process according to a first embodiment of the invention.

FIG. 3 is a cross-sectional diagram showing the structure after a contact mask and etch process according to a first embodiment of the invention. The contact mask 121 is preferably formed of a photoresist and patterned in a conventional lithography process. The pattern is developed to form via holes 123 above the source and drain regions 109. After an etch step through the protective oxide layer 119, another etch process which is selective to silicon as compared to the protective layer etches via holes through the source and drain regions, stopping on the BOX layer 105.

Figure 4:
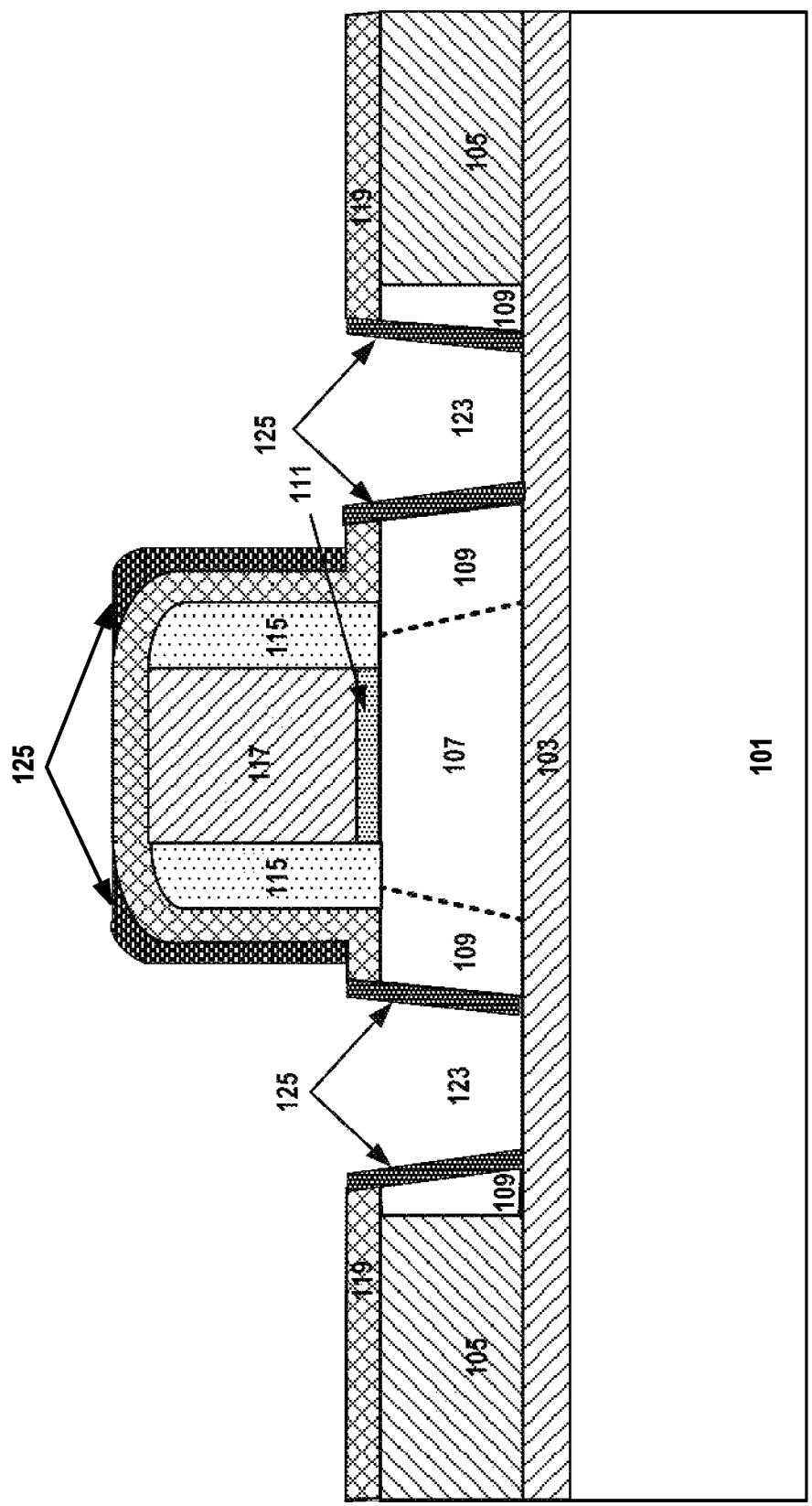
FIG. 4 is a cross-sectional diagram depicting the structure after the contact mask has been removed and dielectric spacers formed according to a first embodiment of the invention.

FIG. 4 is a cross-sectional diagram depicting the structure after the contact mask has been removed and dielectric spacers are formed according to a first embodiment of the invention. The dielectric spacers 125 are needed to form an etch mask through the BOX layer 105 and into the substrate 101 to form the contact hole as well as to protect the Si channel 109 from the Si etch. Consequently, the dielectric spacers 125 should be composed of a material which has different etch characteristics than the BOX layer 105 and substrate 101 such as silicon nitride. The protective SiO2 layer 119 is preferably thicker and/or denser than the BOX layer 105. In an ETSOI process, a typical BOX thickness is about 25 nm. Therefore to avoid losing all protection on top of the gate, the SiO2 layer 119 can be thicker, e.g., 50 nm. In some embodiments of the invention, a thicker protective layer 119 may not be possible given the other process steps, which is why the dense oxide is preferred in embodiments of the invention. The dense oxide has a slower etch rate than the BOX which has a different chemical structure.

Figure 5:
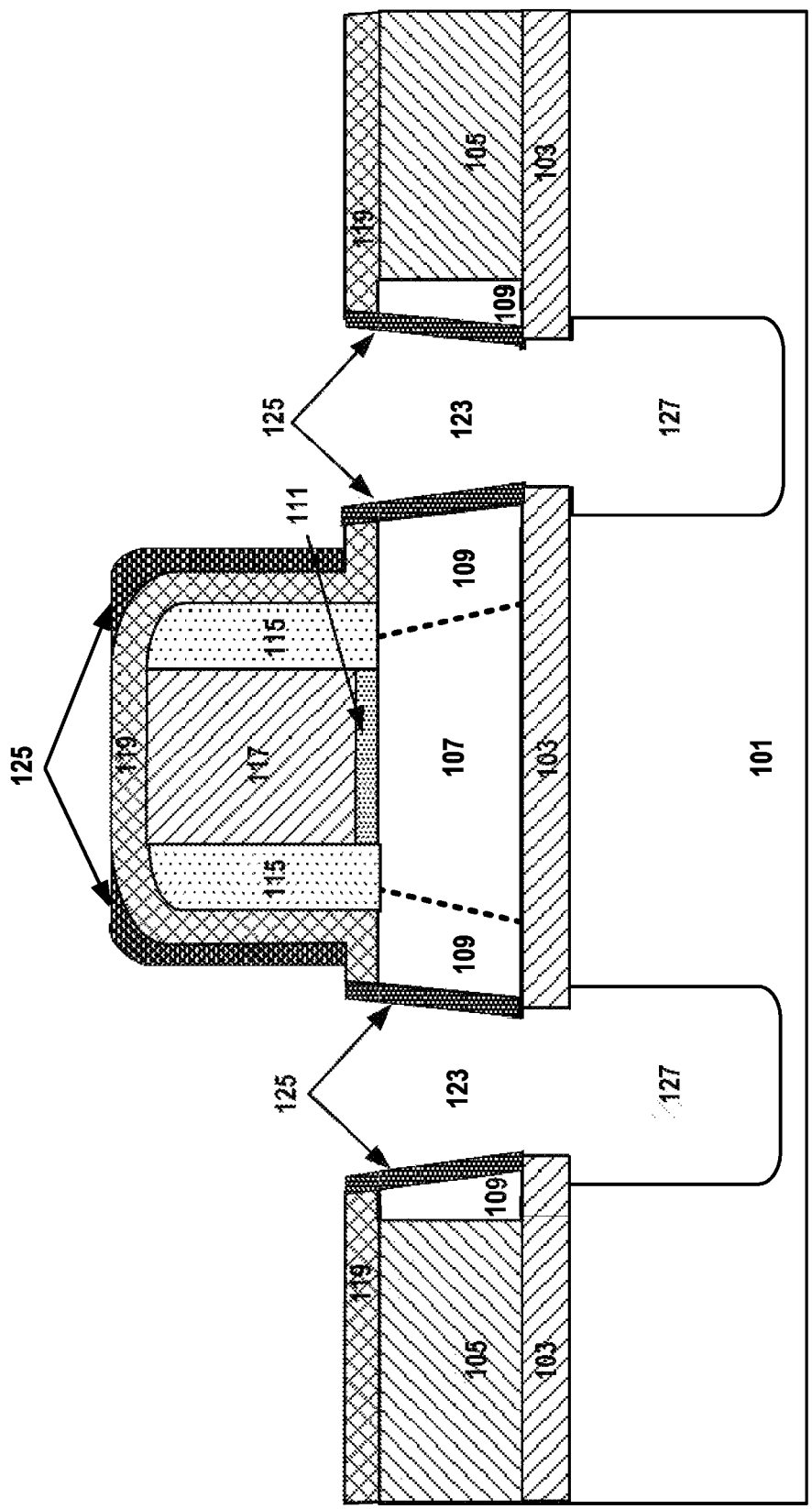
FIG. 5 is a cross-sectional diagram depicting the structure after the deep contact hole etch according to a first embodiment of the invention.

FIG. 5 is a cross-sectional diagram depicting the structure after the deep contact hole etch according to a first embodiment of the invention. Using a highly selective Si etch process the deep contact holes 127 are formed in the substrate 101. Preferably, the contact holes are between 30 nm and 200 nm deep to reliably penetrate the BOX and survive later steps. The cross-section of the contact stud will be set by the contact hole dimensions. The contact holes can have some variability in depth as a later chemical mechanical polishing step will correct the height of the resulting contact stud.

Figure 6:
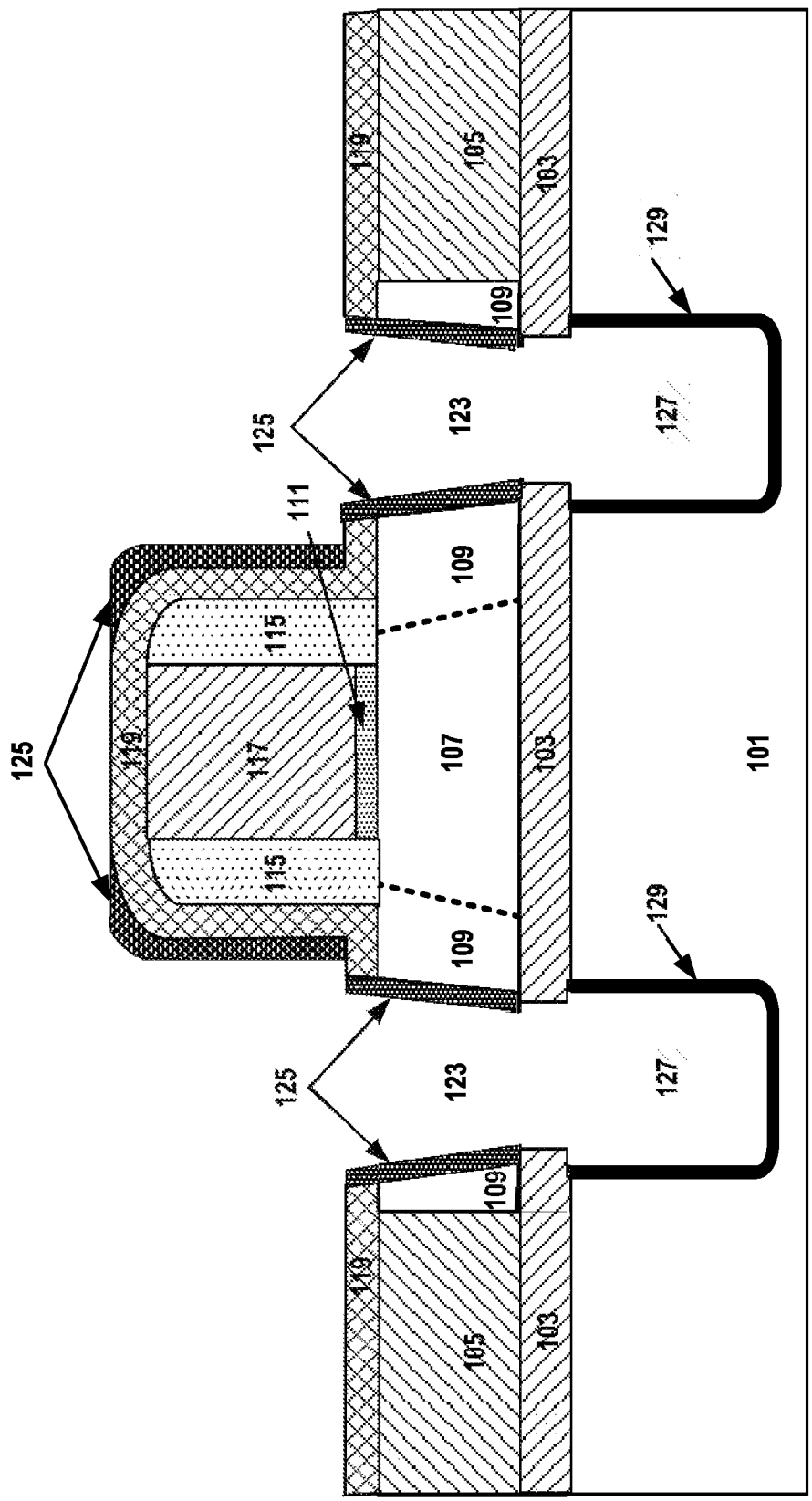
FIG. 6 is a cross-sectional diagram depicting the structure after an isolation layer has been formed in the contact holes according to a first embodiment of the invention.

FIG. 6 is a cross-sectional diagram depicting the structure after an isolation layer has been formed in the contact holes according to a first embodiment of the invention. The isolation layer 129 will isolate the future contact from the substrate layer 101. In preferred embodiments, the isolation layer 129 is a dielectric layer which is grown from the substrate 101 such as silicon dioxide from a silicon substrate in a thermal oxide process. Alternative materials that are not affected by the spacer removal etch can be used. This dielectric layer 129 will eventually surround the deep contact studs and will help ensure that any residual backside (substrate) material does not short the deep contacts, i.e. form a weak conduction path.

In alternative embodiments, using a silicon substrate without a BOX layer, the process is similar but the first source/drain etch hole etch needs to endpoint at a predetermined depth prior to the spacer 129 formation. This can be done with a timed etch. The original process is picked up after the isolation layer 129 formation.

Figure 7:
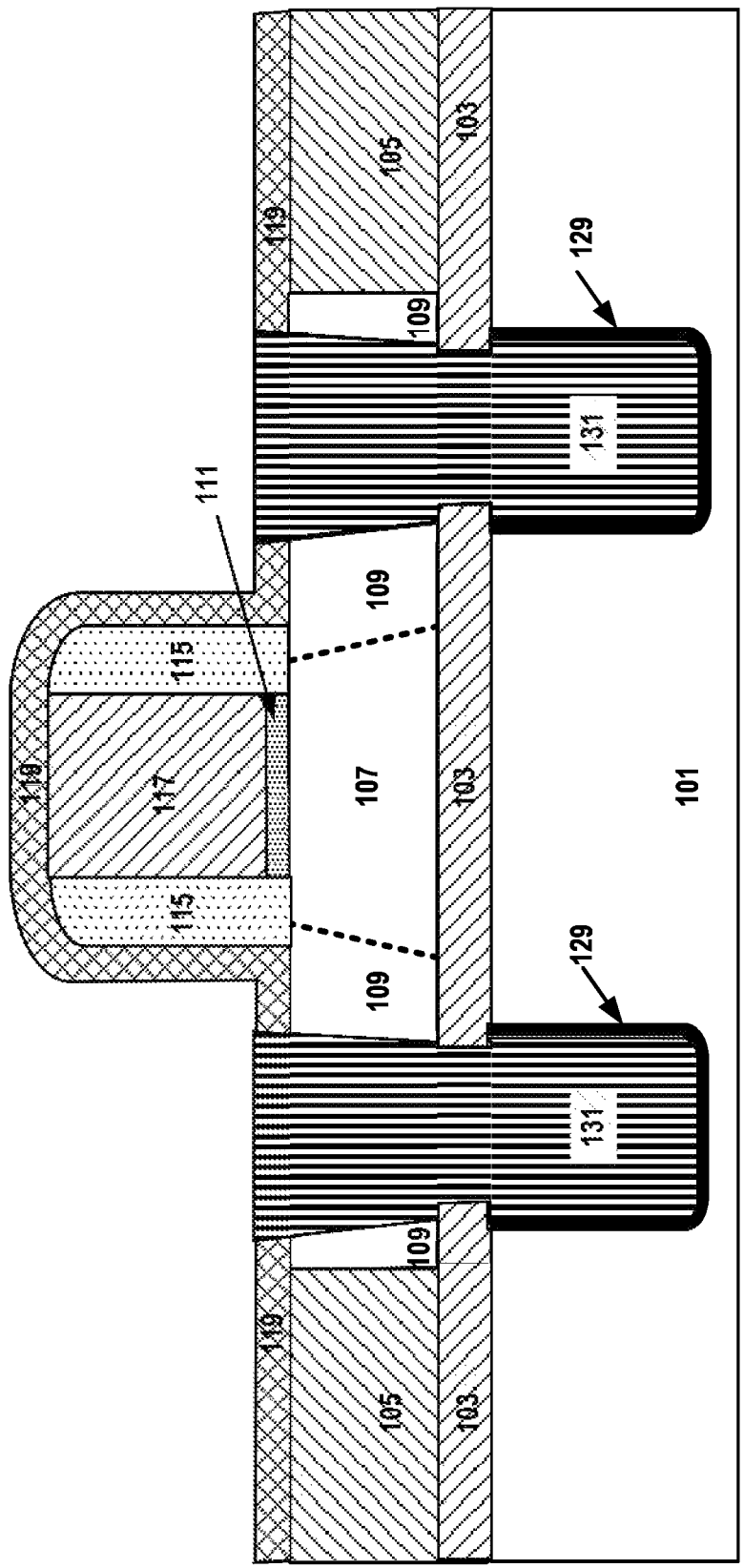
FIG. 7 is a cross-sectional diagram depicting the structure after the protective dielectric material has been removed and the contact holes have been filled with a contact metal according to a first embodiment of the invention.

FIG. 7 is a cross-sectional diagram depicting the structure after the protective spacer material 125 has been removed and the contact holes have been filled with a contact metal 131 according to a first embodiment of the invention. In the drawing, the protective spacers 125 have been removed in an etch step. The contact holes have been filled with a contact metal 131 such as tungsten. The tungsten may be deposited by any conventional deposition process including chemical vapor deposition (CVD), plasma enhanced chemical vapor deposition (PECVD), atomic layer deposition (ALD) or sputtering. The filled contact holes 131 form contact studs which will be used connect the source and drain regions 109. Other typical contact stud materials can be used such as Pt, Ti, TiN, Mo, Pt, Co to form the contact studs.

Figure 8:
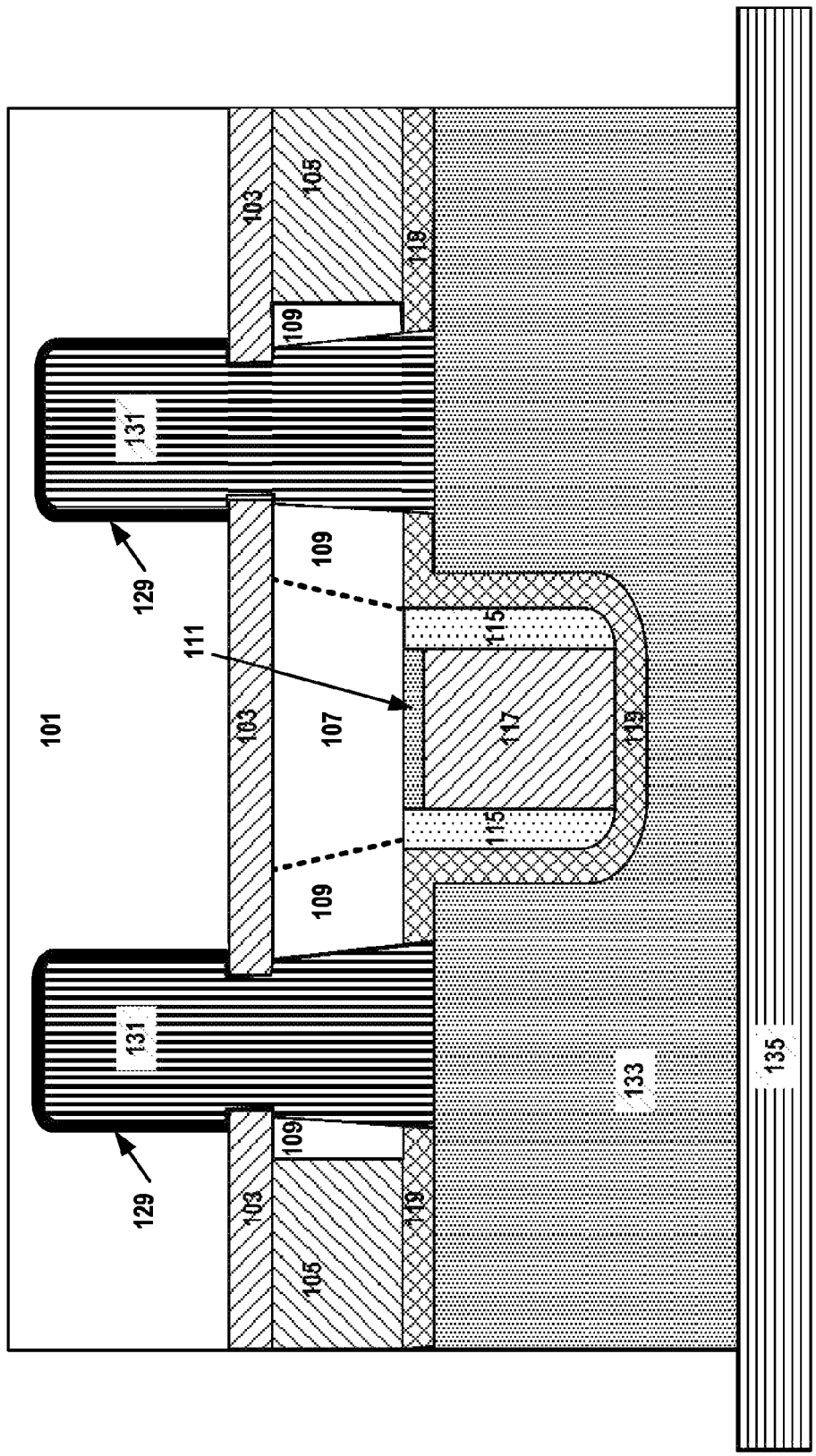
FIG. 8 is a cross-sectional diagram depicting the structure after the substrate wafer has been attached to a handle wafer and flipped for further processing according to a first embodiment of the invention.

FIG. 8 is a cross-sectional diagram depicting the structure after the substrate wafer has been attached to a handle wafer and flipped for further processing according to a first embodiment of the invention. In this drawing, an adhesive material 133 has been applied to the gate structure 117 side of the device and the entire substrate wafer is attached to a handle wafer 135 so that the contact stud side of the substrate wafer can be subjected to further processing.

Figure 9:
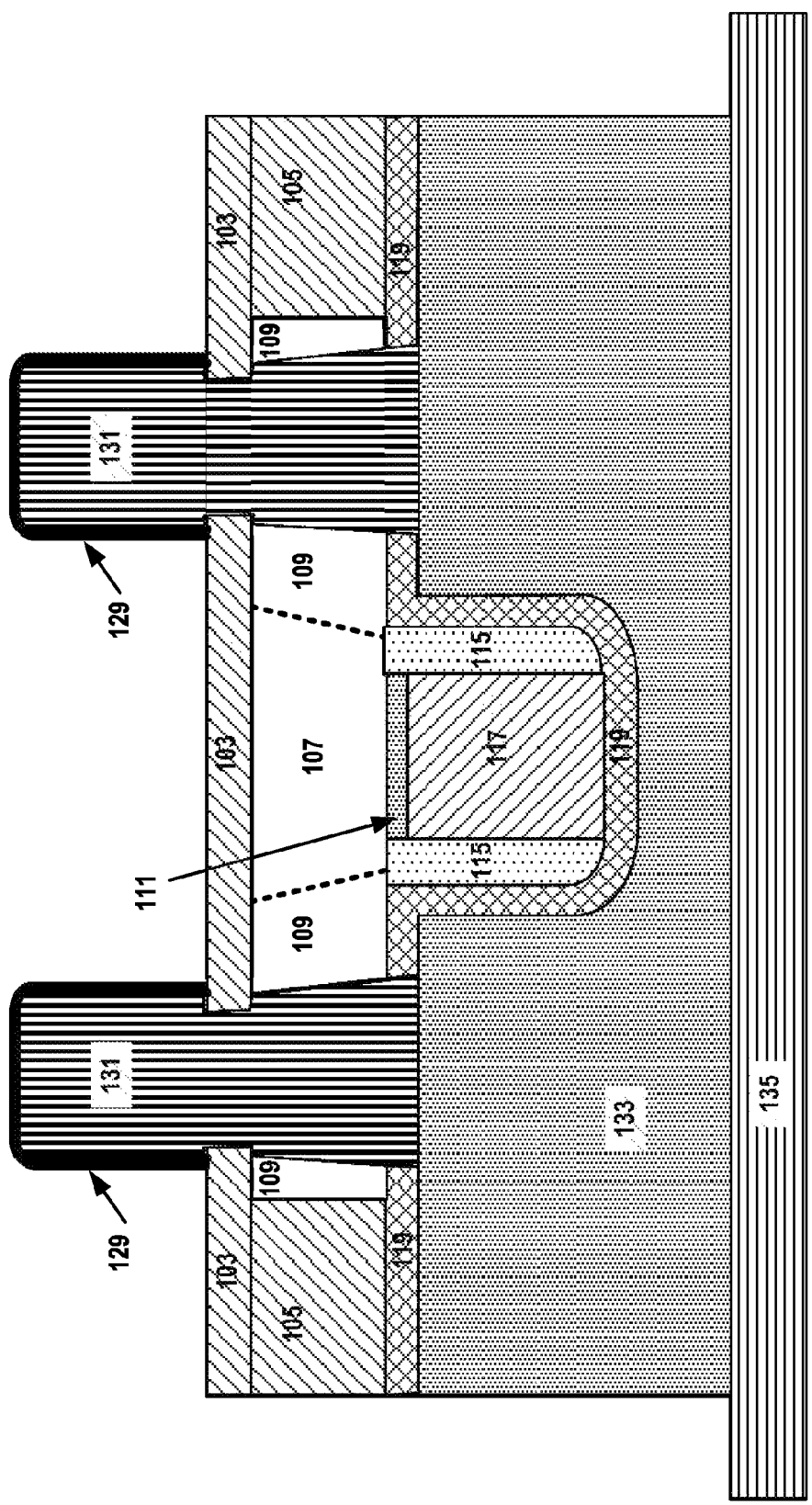
FIG. 9 is a cross-sectional diagram depicting the structure after a combined chemical mechanical polishing and etch process according to a first embodiment of the invention.

FIG. 9 is a cross-sectional diagram depicting the structure after a combined chemical mechanical polishing and etch process according to a first embodiment of the invention. A chemical mechanical polishing step is used to remove the bulk of the substrate wafer 101 up until an approximation of the ends of the previously formed contact studs are reached. Next, a wet etch or reactive ion etch step is used to remove a remainder of the substrate 101 until the BOX 103, which is used as an etch stop, is encountered. At this point, the substrate material 101 is substantially level with the dielectric areas 103 and the contact studs are revealed.

Figure 10:
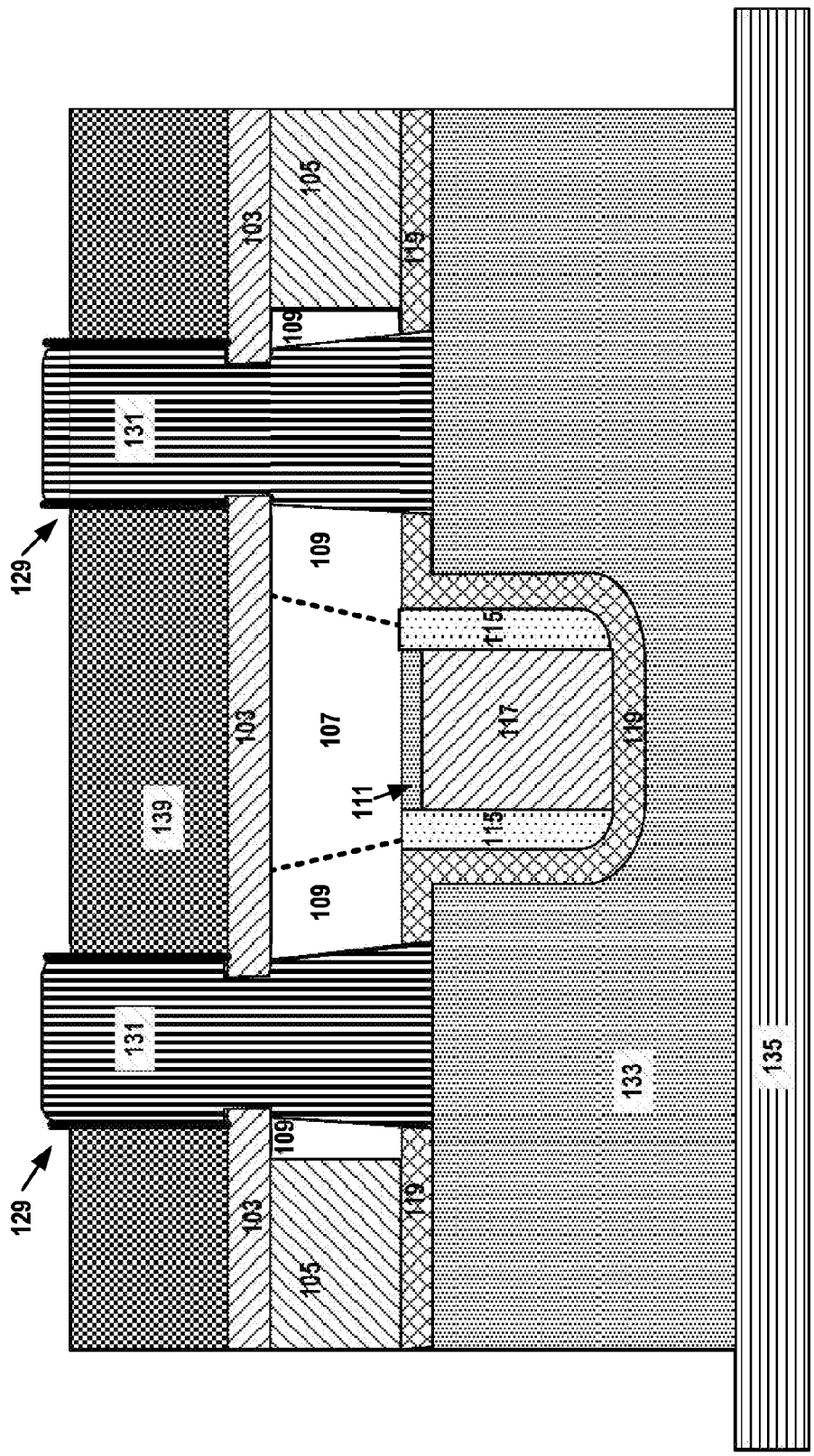
FIG. 10 is a cross-sectional diagram depicting the structure after a dielectric refill followed by a combined chemical mechanical polishing and etch to reveal the contact studs according to a first embodiment of the invention.

FIG. 10 is a cross-sectional diagram depicting the structure after a dielectric refill followed by a chemical mechanical polishing (CMP) and/or etch process to reveal the contact studs according to a first embodiment of the invention. A dielectric layer 139, such as a low k dielectric, is used to refill the structure. In one preferred embodiment, the dielectric deposition is followed by a chemical mechanical polishing and etch step which reveals the top of the contact studs 131 and removes the protective isolation layer 129 from the top of the contact studs 131. In other embodiments of the invention, CMP could be performed until the contact studs were encountered, thereby cutting off the stud tops and making the contact stud ends flush.

Figure 11:
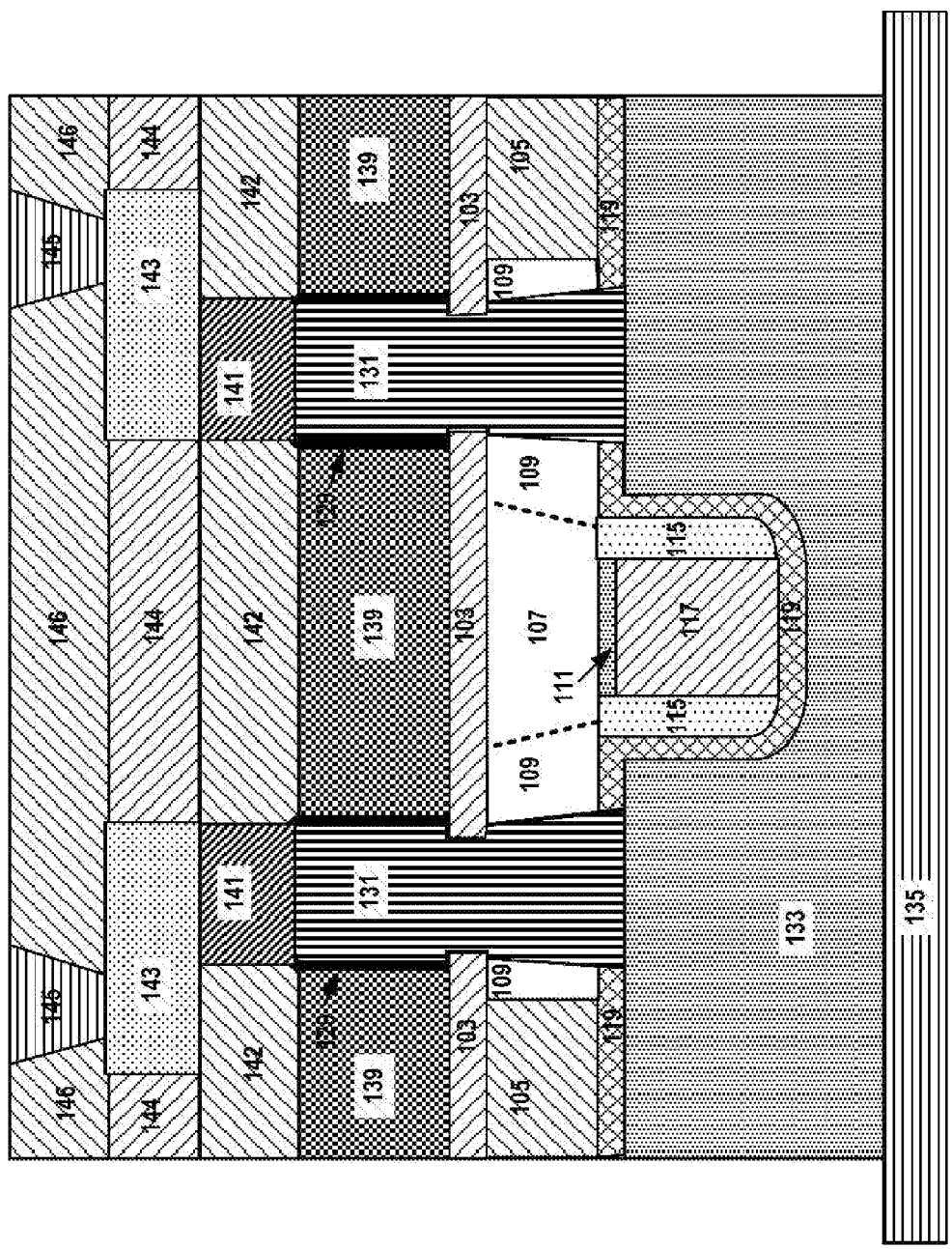
FIG. 11 is a cross-sectional diagram depicting the structure after a first metallization wiring layer has been patterned over the contact studs according to a first embodiment of the invention.

FIG. 11 is a cross-sectional diagram depicting the structure after a first metallization wiring layer has been patterned over the contact studs according to a first embodiment of the invention. Contact metallurgy 141 has been formed over and in electrical contact with contact studs 131. The contact metallurgy 141 may be of tungsten or another suitable metal and may be formed in a stud structure in a dielectric layer 142 over dielectric layer 139. The first metallization wiring level 143 is formed over the contact metallurgy 141 in dielectric layer 142 and couples the device to the rest of the integrated circuit. The metallization wiring continues in a conventional manner, e.g., with conductive contact vias 145 in dielectric layer 146. In one embodiment, the first metallization wiring level 143 is composed of a conductive metal such as Cu, W or Al. In another embodiment, the conductive material 143 comprises Cu or a Cu alloy such as AlCu. The tungsten of the contact metallurgy 141 and conductive material of the wiring level 143 may be formed by any conventional deposition process including chemical vapor deposition (CVD), plasma enhanced chemical vapor deposition (PECVD), atomic layer deposition (ALD) or sputtering. In preferred embodiments of the invention, the metallization wiring level 143 stud that contacts is larger than the contact metallurgy 141 which contacts the exposed backside source and drain contact studs. Thus, the contact conductivity is increased with minimal cap-to-gate/performance impact.

Although not shown, a gate contact stud can be formed using processes similar to those shown for the contact studs coupled to the source and drain regions. To reduce capacitive coupling, the gate contact should be located on a gate stripe which will distance the gate contact stud from the source and drain contact studs. Such an arrangement is described in reference to FIGS. 14 and 15. Since the contact stud for the gate structure must also etch through the thickness of the gate bordered contact structure or the gate line, a separate set of lithography and etch steps is preferably used for the gate bordered contact structure/gate line. It is desired that the contact studs for both the source/drain and the gate can be formed at approximately the same height at the opposite side of the substrate. Since the chemical mechanical polishing step will level contact studs at different heights, the depth/height of the contact studs for the gate and source/drain needs only to be approximately the same.

Once the wafer processing is complete, i.e., through the last metal layer, the adhesive holding the wafer to the handle wafer is removed using an appropriate solvent, a permanent gate-side support layer, e.g., another permanent adhesive layer, is applied and the chip is mounted to its final packaging. At this point, the final permanent adhesive layer can be optimized for heat conduction by including a high-thermal conductivity material. This two-adhesive process allows for the first adhesive to be a processing-convenient material like SiO2, another dielectric material, or other chemical adhesive for handling the wafer and also allows for the final adhesive to be optimized for final packaging.

In an alternative embodiment, some of the source and drain material which was etched out of the contact hole to form the contact stud can be replaced with crystalline silicon or other highly-conductive material. For example, the contact holes could be only partially filled with W (e.g.) and then the rest of the space filled with another material like Si or other highly conductive material. Other embodiments could use a combination of metals depending on the desired electrical characteristics of the semiconductor device.

As shown in the drawings, the novel structure of the present invention maintains a lateral spacing between the contacts 131 for source and drain and the gate structure 117 while dramatically increasing the physical distance as compared with conventional gate-to-source/drain contacts. This structure reduces the source/drain to gate coupling, parasitic capacitance and other problem associated with higher density devices. The materials and processes used are mostly conventional and thus can be easily adapted to an existing semiconductor line. The gate-down design with the gate in close thermal proximity to the packaging allows for enhanced heat flow from the channel through the gate and out the backside and thus the package which could have a heatsink mounted on it. This will help lower the chip operating temperature.

Figure 12:
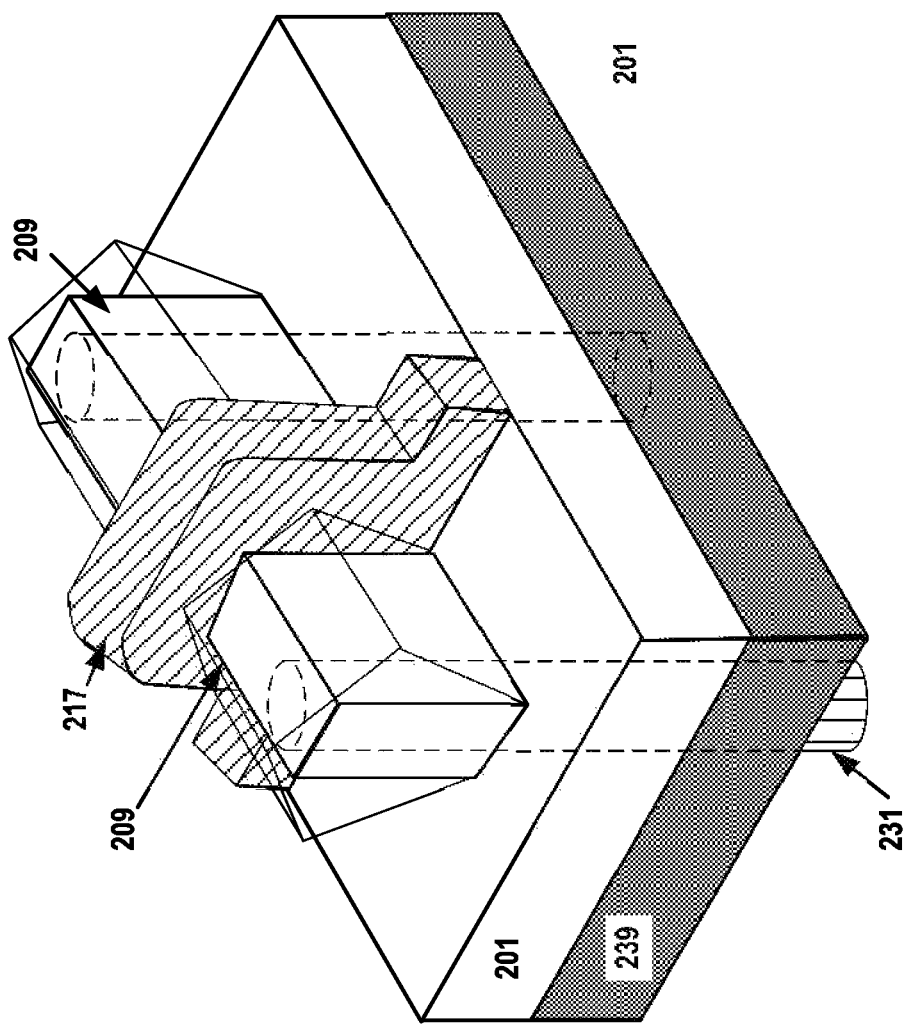
FIG. 12 is a perspective diagram of a FinFET structure after the contact studs have been formed according to a second embodiment of the invention.
Figure 13:
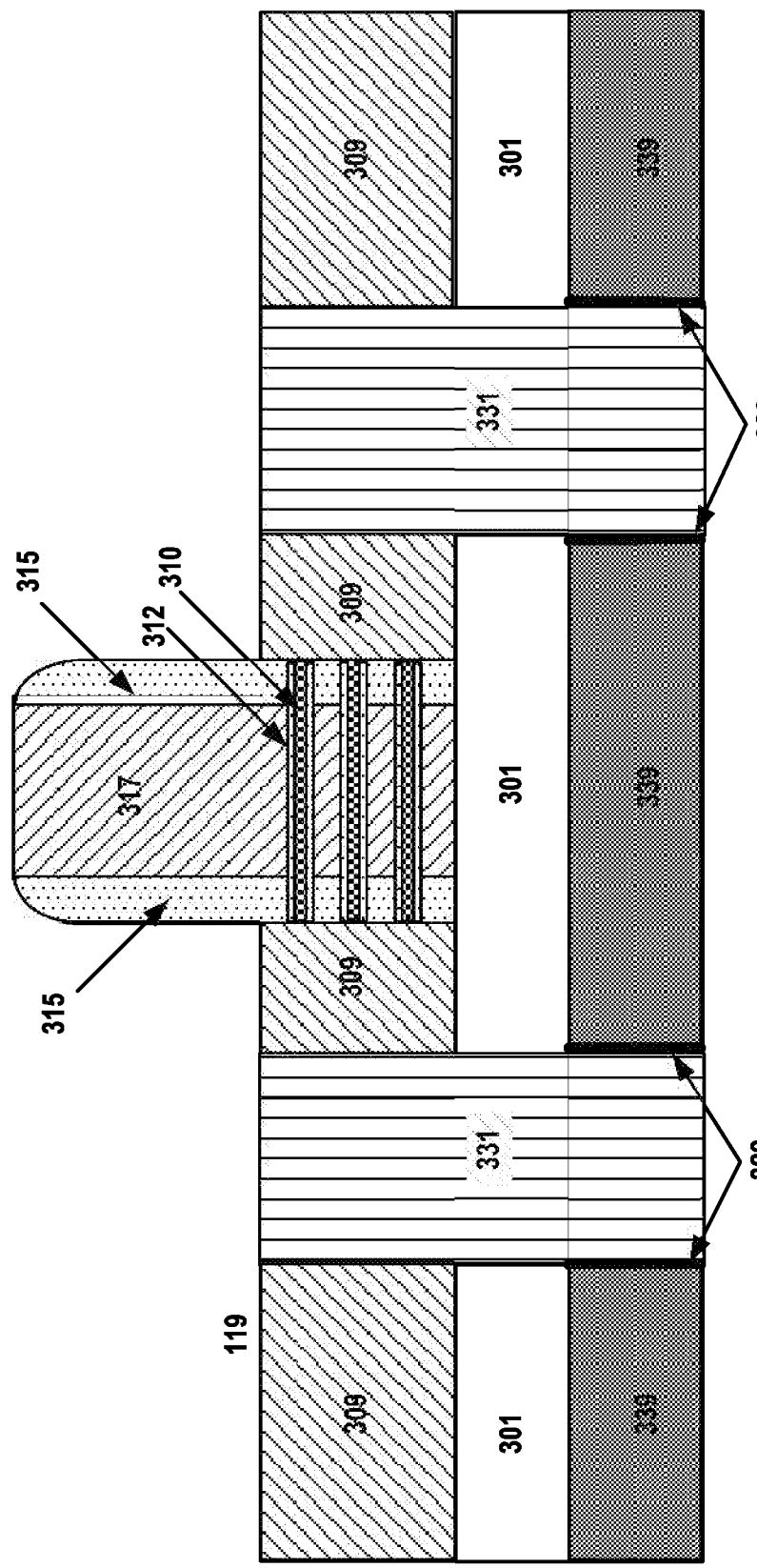
FIG. 13 is a cross-sectional diagram of a Nanosheet structure after the contact studs have been formed according to a third embodiment of the invention.

FIGS. 12 and 13 show additional embodiments of the invention in a FinFET embodiment and a Nanosheet embodiment respectively. However, those skilled in the art will appreciate that the principles of the invention can be incorporated into other devices as well.

FIG. 12 is a perspective diagram of a FinFET structure after the contact studs have been formed according to a second embodiment of the invention. For ease in illustration, the handle wafer and final adhesive layer are not shown. On substrate 201, source and drain 209 portions of the fin are disposed. As depicted, optional crystalline silicon can be grown over the source and drain regions to improve device performance. The gate structure 217 is disposed over a central portion of the fin and the BOX 201. Contact studs 231, shown as dashed lines, are formed through source and drain regions and the substrate 201 to end on the side of the substrate opposite to the gate structure. The metallization lines (not shown) will be formed on the opposite side of the substrate as discussed above in connection with the planar MOSFET embodiment.

FIG. 13 is a perspective diagram of a Nanosheet structure after the contact studs are been formed according to a third embodiment of the invention. As above in FIG. 12, the handling wafer and adhesive layer are not shown. A Nanosheet or multichannel MOSFET (also known as MCFET) structure is comprised of sets of stacked channels between source and drain regions 309 disposed over the substrate 301 which includes a BOX layer. The stacked channels comprise thin semiconductor layers or semiconductor nanowires 310 which are wrapped by gate dielectric layer(s) 312 which are in turn wrapped by a conductive gate electrode material 317. The gate material 317 is protected by dielectric spacers 315. The contact studs 331 are shown formed through the source and drain regions 309 and the substrate in a process similar to that described in connection with the first embodiment. The contact studs 331 are protected by the isolation layer 329 which protects the contact studs from shorts due to any residual substrate. The wiring layers (not shown) will be formed on the side of the substrate opposite to the gate structure 317 and on top of dielectric layer 339.

Figure 14:
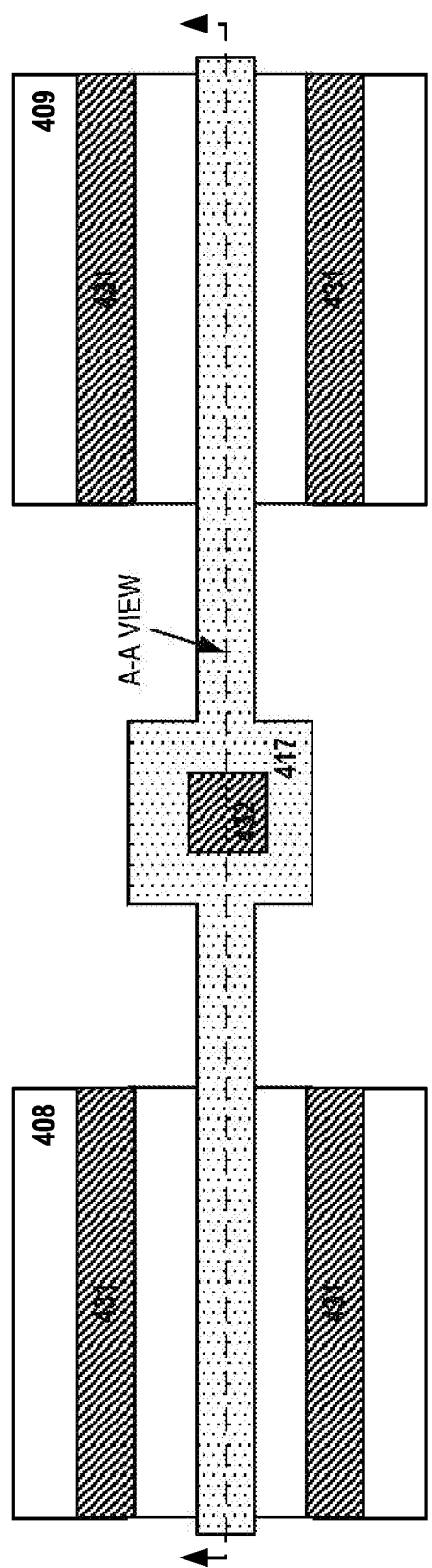
FIG. 14 is a top view of an inverter layout with trench contacts formed according to a fourth embodiment of the invention.

FIG. 14 is a top view of an inverter layout with trench contacts formed according to a fourth embodiment of the invention. An inverter circuit outputs a voltage representing the opposite logic-level to its input. Its main function is to invert the input signal applied. An inverter is a basic building block in digital electronics. Multiplexers, decoders, state machines, and other sophisticated digital devices may use inverters. As shown in the figure, the pFET diffusion region 408 and nFET diffusion region 409 are coupled together by gate stripe 417 which controls the gate stack of both devices. Trench contacts 431 are used to electrically couple the output and Vdd regions the pFET diffusion region 408 and output and ground regions in the nFET diffusion region 409. Of note is that the gate contact stud 432 is relatively distant from the trench contact studs 431 to reduce capacitive coupling and other negative effects. The central broadened contact pad is optional, but provides better electrical characteristics for gate contact 432.

Figure 15:
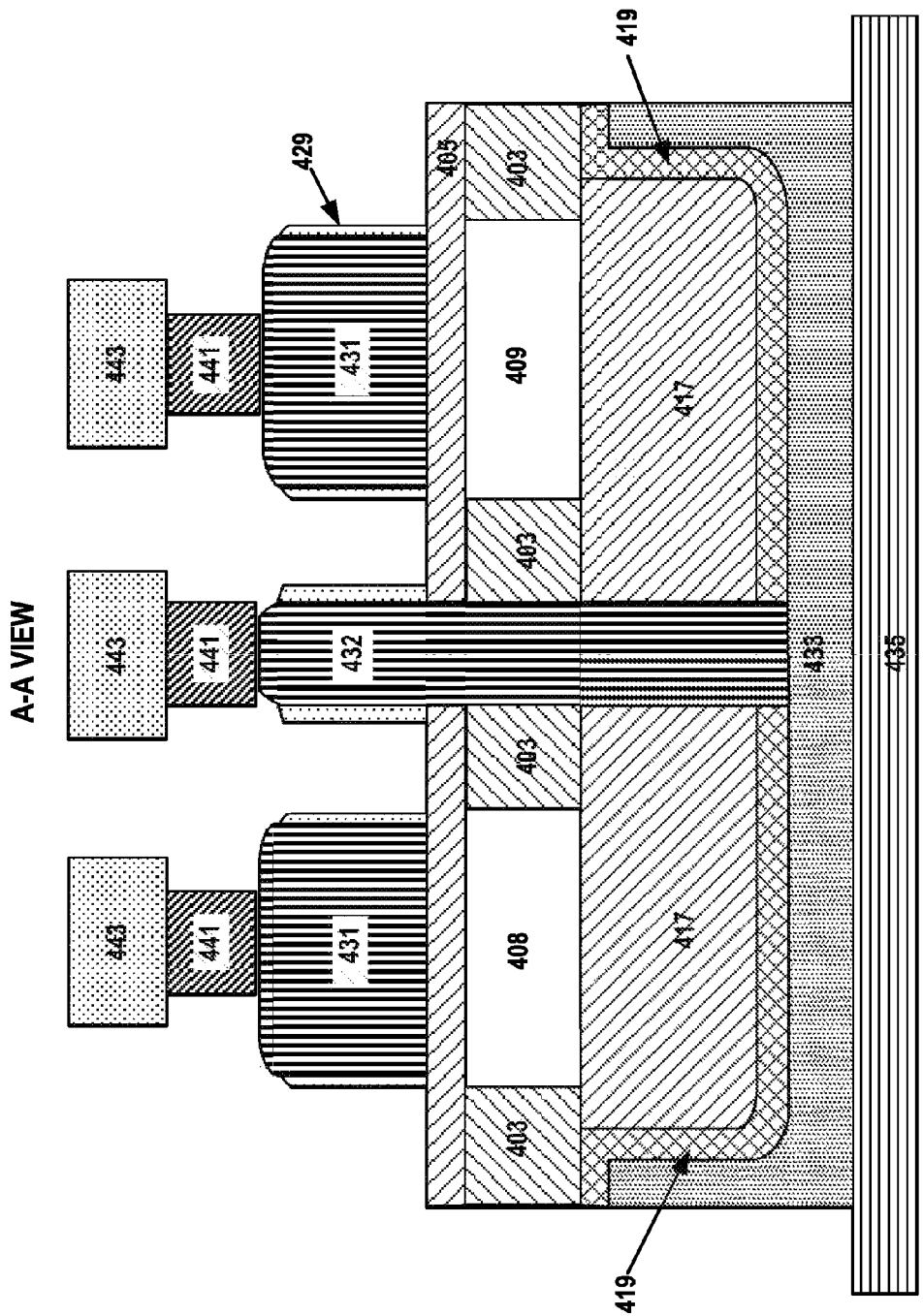
FIG. 15 is a cross-sectional diagram of the inverter layout with trench contacts in the fourth embodiment of the invention.

FIG. 15 is a cross-sectional diagram of the inverter layout with trench contacts in the fourth embodiment of the invention. This figure shows the fourth embodiment at the same point in the process as FIG. 11 shows the first embodiment except that the dielectric layers in the metallization are omitted for clarity. Isolating dielectric 403 isolates the pFET channel region 408 and nFET channel region 409 from the gate contact 432 and the surrounding transistors (not shown). The BOX layer 405 isolates the pFET channel region 408 and nFET channel region 409 from the metallization layers. The gate contact 432 extends to the depth of the gate stripe 417 and protective layer 419. Because of the placement of the cross-section, the depth of the trench contacts 431 in the pFET channel region 408 and nFET channel region 409 is not shown, but the trench contacts would extend past the pFET channel region 408 and nFET channel region 409 plus the depth of the protective layer 419. The adhesive layer 433 bonds the device to handle wafer 435. Contact metallurgy 441 has been formed over and in electrical contact with contact studs 431. The first metallization wiring level 443 is formed over the contact metallurgy 441. The dielectric layers are omitted so that the drawing can show the contact studs and wiring levels at the point of the cross-section, but would be in place in a functioning device.

Figure 16:
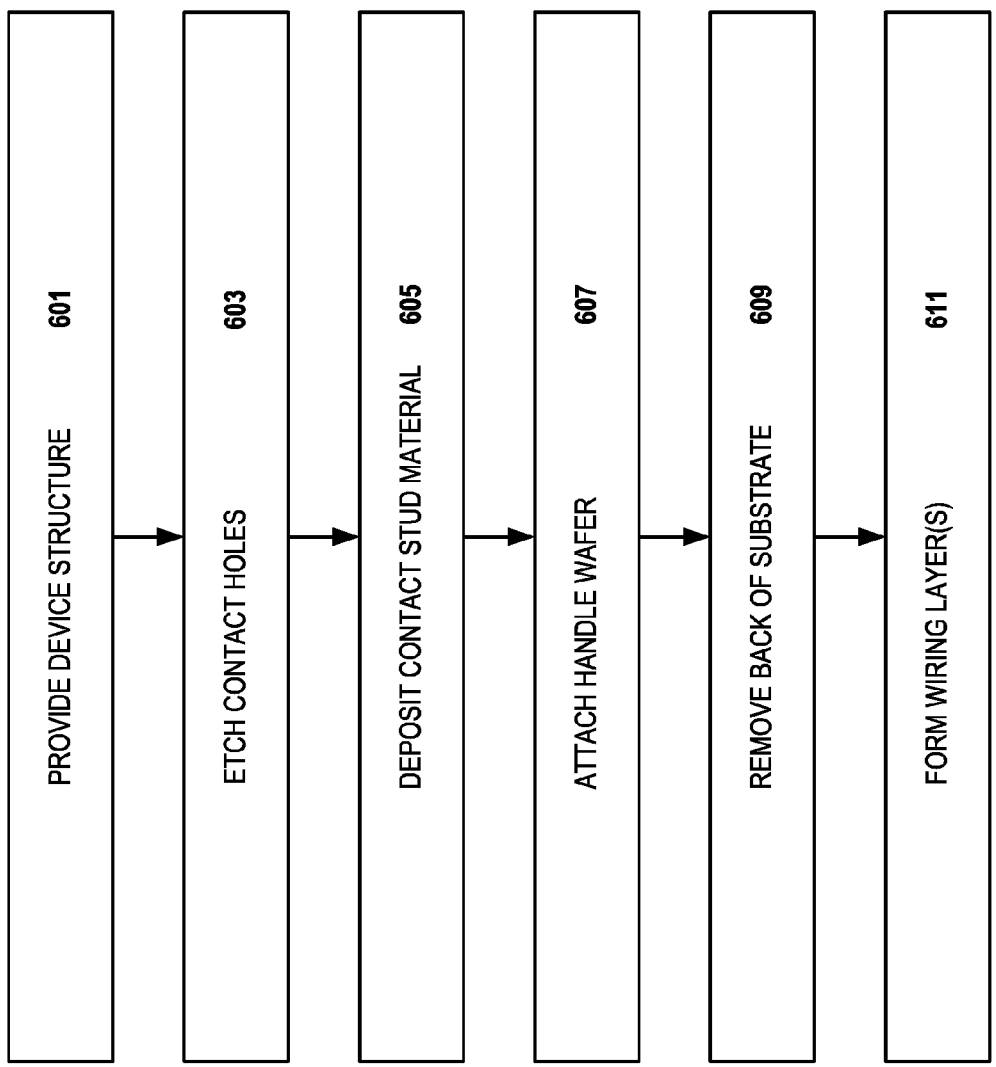
FIG. 16 is a flow diagram of the general process steps of method embodiments of the invention.

FIG. 16 is a flow diagram of the general process steps of method embodiments of the invention. While those skilled in the art will appreciate that variations of the following steps will occur in embodiments of the invention, most embodiments of a method for implementing the invention will follow the general process steps. In 601, a device structure comprising a gate structure and source and drain regions is provided. The device structure is preferably at the point in the process where contact metallurgy (or other conductive material) is about to be formed. In 603, contact holes are etched through the source and drain regions to a desired depth in the substrate. A contact hole for the gate structure, if desired, is also etched in its own set of lithography steps. As is mentioned above, since the contact stud for the gate structure must also etch through the thickness of the gate structure or the gate line, a separate set of lithography and etch steps may be used so that the contact studs can be formed at approximately the same height at the opposite side of the substrate. In 605, the conductive stud material is deposited in the contact holes. In 607, the substrate wafer is flipped in orientation and attached to a handle wafer by means of an adhesive. The opposite side of the substrate (from the gate structure) is removed in step 609 so that the tops of the contact studs are revealed. As is mentioned above, in preferred embodiments, the removal process is a combination of a chemical mechanical polishing process and an etch process. In 611, the wiring layers are formed on the side of the substrate opposite to the gate structure.

In alternative embodiments, an epitaxially (epi) grown silicon layer is grown in the source and drain regions. For example, in a planar MOSFET device, the epi silicon layers would form pads over regions 109 in FIG. 1. The epitaxial silicon pad will increase the amount of silicon in the source and drain regions and can improve device performance. The processing would continue with the protective layer 119 in FIG. 2 and the main difference being that the contact hole and therefore contact stud would go through the additional pad of epi silicon. Similarly, in the FinFET and Nanosheet embodiments an epi silicon layer can be grown over source/drain before the contact hole definition begins.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a semiconductor device comprising:
    providing a device structure including a gate structure, source and drain regions disposed on a first surface of a substrate;
    etching respective contact holes first through an entire thickness of the source and drain regions disposed on the first surface of the substrate and then continuing etching through a first portion of the substrate underlying the source and drain regions;
    filling the contact holes with a conductive material to produce contact studs respectively through the entire thickness of the source and drain regions; and
    removing a second portion of the substrate to expose a surface of the contact studs on a second surface of the substrate opposite to the gate structure.

2. The method as recited in claim 1 further comprising:
    depositing a dielectric layer over the second surface of the substrate opposite to the gate structure; and
    depositing a metallization wiring layer over the second surface of the substrate opposite to the gate structure, and coupled to the surface of the contact studs.

3. The method as recited in claim 2, further comprising:
    depositing a layer of protective insulator in the contact holes prior to filling the contact holes with the conductive material.

4. The method as recited in claim 3, wherein the conductive material is tungsten.

5. The method as recited in claim 1, wherein the etching of the contact holes is a multi-step etching process.

6. The method as recited in claim 1, wherein the removing a second portion of the substrate comprises a chemical mechanical polishing process followed by an etch process.

7. A method for fabricating a semiconductor device comprising:
etching contact holes first through an entire thickness of the source and drain regions of a device structure and then continuing etching through a first portion of a substrate, wherein a gate structure and the source and drain regions of the device structure are disposed on a first surface of the substrate;
filling the contact holes with a conductive material to produce contact studs respectively through the entire thickness of the source and drain regions;
attaching a handling wafer to the first surface of the substrate;
removing a second portion of substrate material from a second surface of the substrate to expose a surface of the contact studs, wherein the second surface of the substrate and the exposed surface of the contact studs are opposite to the first surface; and
depositing a metallization wiring layer over the exposed surface of the contact studs, wherein the metallization layer is disposed over the second surface.

8. The method as recited in claim 7, further comprising depositing a dielectric layer over the second surface of the substrate opposite to the gate structure.

9. The method as recited in claim 7, further comprising:
depositing a protective insulator layer over the device structure; and
patterning a photoresist layer over the protective insulator layer, wherein areas of the source and drain regions are exposed.

10. The method as recited in claim 9, further comprising:
etching through the source and drain regions to an underlying oxide layer forming a first portion of the contact holes;
forming a protective dielectric layer on sidewalls of the first portion of the contact holes to form an etch mask; and
etching through the underlying insulator layer and the first portion of the substrate to form a second portion of the contact holes.

11. The method as recited in claim 10, further comprising:
performing a chemical mechanical polishing step to remove an initial amount of the second portion of the substrate; and
performing an etch or reactive ion etch step is used to remove a remainder of the second portion of the substrate, wherein dielectric layers of the device are used as an etch stop.

12. The method as recited in claim 7, wherein the handling wafer is attached by means of an adhesive layer.

13. The method as recited in claim 1, further comprising:
forming a gate contact stud through the gate structure on the first surface and a portion of the substrate to a respective portion of the wiring layer disposed over the second surface of the substrate.

14. The method as recited in claim 7, further comprising:
forming a first mask on the first surface of the substrate to etch the contact holes through the source and drain regions;
forming a second mask on the first surface of the substrate to etch a contact hole through the gate structure and a second portion of the substrate which underlies the gate structure to form a gate contact hole; and
filling the gate contact hole with a conductive material to produce a gate contact stud through the gate structure and second portion of the substrate.

15. The method as recited in claim 1, further comprising:
forming a gate stripe on the first surface, the gate stripe electrically connected to the gate structure; and
forming a gate contact stud through the gate stripe on the first surface and a portion of the substrate to a respective portion of the wiring layer disposed over the second surface of the substrate.

* * * * *